(12) United States Patent
Deng et al.

(10) Patent No.: US 10,866,128 B2
(45) Date of Patent: Dec. 15, 2020

(54) METHOD AND APPARATUS FOR DETERMINING FLOW RATES OF COMPONENTS OF MULTIPHASE FLUID

(71) Applicant: PetroChina Company Limited, Beijing (CN)

(72) Inventors: Feng Deng, Beijing (CN); Ruidong Zhao, Beijing (CN); Junfeng Shi, Beijing (CN); Xin Zhang, Beijing (CN); Jianjun Zhang, Beijing (CN); Chunming Xiong, Beijing (CN); Xishun Zhang, Beijing (CN); Yi Peng, Beijing (CN); Shiwen Chen, Beijing (CN); Wei Yang, Beijing (CN)

(73) Assignee: PETROCHINA COMPANY LIMITED, Beijing (CN)

( * ) Notice: Subject to any disclaimer, the term of this patent is extended or adjusted under 35 U.S.C. 154(b) by 316 days.

(21) Appl. No.: 15/983,889

(22) Filed: May 18, 2018

(65) Prior Publication Data

US 2019/0086249 A1 Mar. 21, 2019

(30) Foreign Application Priority Data

Sep. 19, 2017 (CN) .......................... 2017 1 08448096

(51) Int. Cl.
*G01F 1/716* (2006.01)
*G01F 5/00* (2006.01)
*G01N 24/08* (2006.01)
*G01F 1/74* (2006.01)
*G01R 33/561* (2006.01)
*G01R 33/563* (2006.01)

(52) U.S. Cl.
CPC ................ *G01F 1/716* (2013.01); *G01F 1/74* (2013.01); *G01F 5/00* (2013.01); *G01N 24/081* (2013.01);

(Continued)

(58) Field of Classification Search
CPC .. G01F 1/716; G01R 33/5615; G01N 24/082; G01N 24/087
See application file for complete search history.

(56) References Cited

U.S. PATENT DOCUMENTS 6,046,587 A 4/2000 King et al.
6,833,698 B2 12/2004 Sun et al.
(Continued)

FOREIGN PATENT DOCUMENTS

CN 105116001 A 12/2015
CN 105334239 A 2/2016
(Continued)

OTHER PUBLICATIONS

Chinese Office Action for Chinese Application No. 201710844809.6, dated Apr. 17, 2019, 9 pages.
(Continued)

*Primary Examiner* — Daniel S Larkin
(74) *Attorney, Agent, or Firm* — Hoffman Warnick LLC

(57) ABSTRACT

The embodiments of the present application disclose a method and an apparatus for determining flow rates of components of multiphase fluid. The method comprises: performing a first magnetization treatment and a second magnetization treatment on multiphase fluid in a pipeline in a target oil and gas well, respectively, to obtain first magnetized multiphase fluid and second magnetized multiphase fluid; determining a first echo train signal set and a second echo train signal set corresponding to the first magnetized multiphase fluid and the second magnetized multiphase fluid, respectively; determining contents of an oil phase component, a water phase component, and a gas phase component of the multiphase fluid at a specified horizon position, and determining a flow velocity of the multiphase fluid at the specified horizon position; and determining flow rates of the oil phase component, the water phase component (Continued)

and the gas phase component in the multiphase fluid. The technical solutions provided by the embodiments of the present application can improve the accuracy of the determined flow rate of each component of the multiphase fluid.

10 Claims, 2 Drawing Sheets

(52) U.S. Cl.
CPC ......... *G01N 24/082* (2013.01); *G01N 24/087* (2013.01); *G01R 33/5615* (2013.01); *G01R 33/56308* (2013.01)

(56) References Cited

U.S. PATENT DOCUMENTS

| | | | |
|---|---|---|---|
| 2010/0094568 | A1 | 4/2010 | Barua et al. |
| 2011/0138928 | A1 | 6/2011 | Xie et al. |
| 2012/0209541 | A1 | 8/2012 | Ong et al. |
| 2016/0313159 | A1 | 10/2016 | Appel et al. |

FOREIGN PATENT DOCUMENTS

| | | |
|---|---|---|
| CN | 106050225 A | 10/2016 |
| WO | 0111190 A1 | 2/2001 |
| WO | 2005057142 A1 | 6/2005 |
| WO | 2011039593 A1 | 4/2011 |
| WO | 2012000645 A1 | 1/2012 |

OTHER PUBLICATIONS

Chinese Search Report for Chinese Application No. 201710844809.6, dated Apr. 17, 2019, 4 pages.
Zhu, Wuming, "Study on nuclear magnetic resonance sensing technology for oil, gas and water multiphase flow," Chinese Doctoral Dissertations and Master's Theses, Full-Test Database, Information Technology, pp. 47-62, Aug. 15, 2016.
Dong et al., "Multiphase Flow Measurements by Flow Sampling", Journal of Xi' an Jiaotong Uniyersity,vol. 43, No. 1, 5 pages, Jan. 2009.

```
┌─────────────────────────────────────────────────┐
│ performing a first magnetization treatment and  │
│ a second magnetization treatment on multiphase  │
│ fluid in a pipeline in a target oil and gas     │
│ well, respectively, to obtain first magnetized  │
│ multiphase fluid and second magnetized          │
│ multiphase fluid, wherein the first             │
│ magnetization treatment comprises a             │
│ pre-magnetization treatment and a detection     │
│ magnetization treatment, and the second         │
│ magnetization treatment comprises a detection   │
│ magnetization treatment                         │
└─────────────────────────────────────────────────┘
                        │
                        ▼                    S101
┌─────────────────────────────────────────────────┐
│ determining a first echo train signal set and   │
│ a second echo train signal set corresponding    │
│ to the first magnetized multiphase fluid and    │
│ the second magnetized multiphase fluid,         │
│ respectively, wherein the first echo train      │
│ signal set comprises a first amplitude value    │
│ of a first echo train signal corresponding to   │
│ a specified horizon position, and the second    │
│ echo train signal set comprises a first         │
│ amplitude value of a second echo train signal   │
│ corresponding to the specified horizon position │
└─────────────────────────────────────────────────┘
                        │
                        ▼                    S102
┌─────────────────────────────────────────────────┐
│ determining contents of an oil phase component, │
│ a water phase component, and a gas phase        │
│ component of the multiphase fluid at the        │
│ specified horizon position according to the     │
│ first amplitude value of the first echo train   │
│ signal and the first amplitude value of the     │
│ second echo train signal, and determining a     │
│ flow velocity of the multiphase fluid at the    │
│ specified horizon position according to the     │
│ first amplitude value of the first echo train   │
│ signal                                          │
└─────────────────────────────────────────────────┘
                        │
                        ▼                    S103
┌─────────────────────────────────────────────────┐
│ determining flow rates of the oil phase         │
│ component, the water phase component and the    │
│ gas phase component in the multiphase fluid,    │
│ according to the contents of the oil phase      │
│ component, the water phase component and the    │
│ gas phase component of the multiphase fluid at  │
│ the specified horizon position and the flow     │
│ velocity of the multiphase fluid at the         │
│ specified horizon position                      │
└─────────────────────────────────────────────────┘
                                             S104
```

FIG. 1

METHOD AND APPARATUS FOR DETERMINING FLOW RATES OF COMPONENTS OF MULTIPHASE FLUID

This application claims priority to Chinese Patent Application No. 201710844809.6, filed on Sep. 19, 2017, with the title "METHOD AND APPARATUS FOR DETERMINING FLOW RATES OF COMPONENTS OF MULTIPHASE FLUID", which is hereby incorporated by reference in its entirety.

TECHNICAL FIELD

The present application relates to the field of oil exploration technologies, and particularly, to a method and an apparatus for determining flow rates of components of multiphase fluid.

BACKGROUND ART

In the field of oil drilling and exploitation engineering, the on-line quantitative detection of the multiphase fluid in the oil and gas well and pipeline is extremely challenging, and there is still no reliable technology to accurately measure the flow rate of each component of the multiphase fluid without an oil-gas-water three-phase separation. Till now, the multiphase fluid metering technology commonly used at home and abroad is to transport the produced multiphase fluid to the gathering station through the pipeline, then perform the three-phase separation, and measure the content of each component. This indirect measurement method has the problems of low efficiency, high cost, data delay, etc., and cannot reflect the true transient liquid production characteristics at the wellhead. In recent years, the direct measurement technology for the multiphase fluid has received extensive attention and has been gradually developed. The appearance of the multiphase flowmeter enables the flow rate of the fluid produced at the wellhead to be metered online without stabilization, separation, full process treatment, etc., thereby minimizing the influence from human factors and truly reflecting the wellhead transient performance, which has a great significance for the precision management of oil reservoirs, the optimization of the production and distribution and the wellhead test, etc.

In recent years, in order to meet the need of the actual industrial production, a batch of new technologies and new instruments have sprung up for metering the flow rate of the multiphase fluid, such as Venturi flowmeter, volumetric flowmeter, mass flowmeter, etc. These flowmeters firstly detect the average flow velocity or the total flow rate of the multiphase flow through sensors, and then acquire the contents of oil, gas and water of the multiphase flow based on component measurement technologies such as the gamma ray absorption technology, the capacitance/conductivity analysis technology, the microwave water content analysis technology and the cross correlation technology, and finally combine the average flow velocity or the total flow rate with the contents of oil, gas and water to calculate the flow rate of each component of the multiphase flow. These methods realize the on-line metering of the flow rate of the multiphase flow, but the practical problems brought about are also very obvious, for example, the instrument has difficulty in defining calibration, having radioactivity, limited application scope, complex interpretation and processing model, and high maintenance cost. In addition, along with the expansion of the exploitation scale of the unconventional oil and gas resources (shale oil and gas, tight oil and gas, oil sands, etc.) and the increase of the number of unconventional oil and gas wells year by year, the multiphase flow rate metering needs to face more oil and gas wells of high gas content, high water content, high viscosity and high salinity, and these factors will directly lead to an exponential rise in the measurement error of the existing sensors. Thus, it is extremely urgent to seek accurate and reliable multiphase flow detection methods which can meet the monitoring requirement of the unconventional oil and gas resources.

SUMMARY OF THE INVENTION

An objective of the embodiments of the present application is to provide a method and an apparatus for determining flow rates of components of multiphase fluid, so as to improve the accuracy of the determined flow rate of each component of the multiphase fluid.

In order to solve the above technical problem, a method and an apparatus for determining flow rates of components of multiphase fluid provided by the embodiments of the present application are implemented as follows:

A method for determining flow rates of components of multiphase fluid, comprising:

performing a first magnetization treatment and a second magnetization treatment on multiphase fluid in a pipeline in a target oil and gas well, respectively, to obtain a first magnetized multiphase fluid and a second magnetized multiphase fluid, wherein the first magnetization treatment comprises a pre-magnetization treatment and a detection magnetization treatment, and the second magnetization treatment comprises a detection magnetization treatment;

determining a first echo train signal set and a second echo train signal set corresponding to the first magnetized multiphase fluid and the second magnetized multiphase fluid, respectively, wherein the first echo train signal set comprises a first amplitude value of a first echo train signal corresponding to a specified horizon position, and the second echo train signal set comprises a first amplitude value of a second echo train signal corresponding to the specified horizon position;

determining contents of an oil phase component, a water phase component, and a gas phase component of the multiphase fluid at the specified horizon position according to the first amplitude value of the first echo train signal and the first amplitude value of the second echo train signal, and determining a flow velocity of the multiphase fluid at the specified horizon position according to the first amplitude value of the first echo train signal; and determining flow rates of the oil phase component, the water phase component and the gas phase component in the multiphase fluid, according to the contents of the oil phase component, the water phase component and the gas phase component of the multiphase fluid at the specified horizon position and the flow velocity of the multiphase fluid at the specified horizon position.

In a preferred solution, the step of determining a first echo train signal set and a second echo train signal set corresponding to the first magnetized multiphase fluid and the second magnetized multiphase fluid, respectively, comprises:

applying a specified pulse sequence to the first magnetized multiphase fluid so that the first magnetized multiphase fluid generates a first echo train signal set, and applying the specified pulse sequence to the second magnetized multiphase fluid so that the second magnetized multiphase fluid generates a second echo train signal set.

In a preferred solution, a magnetic field employed in the detection magnetization treatment comprises a gradient magnetic field to calibrate positions of a plurality of horizons of the multiphase fluid in a stratified flow within the pipeline, and wherein a direction of the gradient magnetic field is parallel to a radial direction of the pipeline and perpendicular to a horizontal plane.

In a preferred solution, the magnetic field employed in the pre-magnetization treatment comprises a uniform magnetic field.

In a preferred solution, the step of determining contents of an oil phase component, a water phase component, and a gas phase component of the multiphase fluid at the specified horizon position according to the first amplitude value of the first echo train signal and the first amplitude value of the second echo train signal comprises:

performing the first magnetization treatment on pure gas phase fluid and pure liquid phase fluid in the pipeline in the target oil and gas well, respectively, to obtain a first magnetized pure gas phase fluid and a first magnetized pure liquid phase fluid; wherein the pure liquid phase fluid comprises an oil phase component and a water phase component;

determining a pure gas phase echo train signal set and a pure liquid phase echo train signal set corresponding to the first magnetized pure gas phase fluid and the first magnetized pure liquid phase fluid, respectively, wherein the pure gas phase echo train signal set comprises a first amplitude value of a pure gas phase echo train signal corresponding to the specified horizon position, and the pure liquid phase echo train signal set comprises a first amplitude value of a pure liquid phase echo train signal corresponding to the specified horizon position;

determining a content of a gas phase component of the multiphase fluid at the specified horizon position according to the first amplitude value of the pure gas phase echo train signal, the first amplitude value of the pure liquid phase echo train signal and the first amplitude value of the first echo train signal; and determining contents of the oil phase component and the water phase component of the multiphase fluid at the specified horizon position based on the content of the gas phase component of the multiphase fluid at the specified horizon position, the first amplitude value of the first echo train signal and the first amplitude value of the second echo train signal.

In a preferred solution, the step of determining a pure gas phase echo train signal set and a pure liquid phase echo train signal set corresponding to the first magnetized pure gas phase fluid and the first magnetized pure liquid phase fluid, respectively, comprises:

applying the specified pulse sequence to the first magnetized pure gas phase fluid so that the first magnetized pure gas phase fluid generates a pure gas phase echo train signal set, and applying the specified pulse sequence to the second magnetized pure liquid phase fluid so that the second magnetized pure liquid phase fluid generates a pure liquid phase echo train signal set.

In a preferred solution, the content of the gas phase component of the multiphase fluid at the specified horizon position is determined using the following equation:

$$A_G = \frac{M_{100\%\ L} - M_{meas}}{M_{100\%\ L} - M_{100\%\ G}}$$

wherein $A_G$ denotes the content of the gas phase component of the multiphase fluid at the specified horizon position, $M_{meas}$ denotes the first amplitude value of the first echo train signal, $M_{100\%\ L}$ denotes the first amplitude value of the pure liquid phase echo train signal, and $M_{100\%\ G}$ denotes the first amplitude value of the pure gas phase echo train signal.

In a preferred solution, the step of determining contents of the oil phase component and the water phase component of the multiphase fluid at the specified horizon position based on the content of the gas phase component of the multiphase fluid at the specified horizon position, the first amplitude value of the first echo train signal and the first amplitude value of the second echo train signal comprises:

subtracting the first amplitude value of the echo train signal corresponding to the gas phase component from the first amplitude value of the first echo train signal and the first amplitude value of the second echo train signal, respectively, based on the content of the gas phase component of the multiphase fluid at the specified horizon position, so as to obtain a first amplitude value of an echo train signal corresponding to the pure liquid phase fluid among the first echo train signals, and a first amplitude value of an echo train signal corresponding to the pure liquid phase fluid among the second echo train signals; and determining the content of the oil phase component and the content of the water phase component of the multiphase fluid at the specified horizon position, according to the first amplitude value of the echo train signal corresponding to the pure liquid phase fluid among the first echo train signals, and the first amplitude value of the echo train signal corresponding to the pure liquid phase fluid among the second echo train signals.

In a preferred solution, the content of the oil phase component and the content of the water phase component of the multiphase fluid at the specified horizon position are determined using the following equation:

$$M_1 = M(0)\left[1 - \exp\left(-\frac{t_{pre} + t_{det}}{T_{1,water}}\right)\right] \square A_{water} + M(0)\left[1 - \exp\left(-\frac{t_{pre} + t_{det}}{T_{1,oil}}\right)\right] \square A_{oil}$$

$$M_2 = M(0)\left[1 - \exp\left(-\frac{t_{det}}{T_{1,water}}\right)\right] \square A_{water} + M(0)\left[1 - \exp\left(-\frac{t_{det}}{T_{1,oil}}\right)\right] \square A_{oil}$$

wherein $M_1$ and $M_2$ denote the first amplitude value of the echo train signal corresponding to the pure liquid phase fluid among the first echo train signals, and the first amplitude value of the echo train signal corresponding to the pure liquid phase fluid among the second echo train signals, respectively; $M(0)$ denotes a magnetization vector after the multiphase fluid is completely magnetized; $t_{pre}$ and $t_{det}$ denote time of the pre-magnetization treatment and time of the detection magnetization treatment, respectively; $T_{1,water}$ and $T_{1,oil}$ denote longitudinal relaxation time of the water phase component and longitudinal relaxation time of the oil phase component in the multiphase fluid, respectively; and $A_{water}$ and $A_{oil}$ denote the content of the water phase component and the content of the oil phase component of the multiphase fluid at the specified horizon position, respectively.

An apparatus for determining flow rates of components of multiphase fluid, comprising a magnetization treatment module, an echo train signal amplitude value determination module, a content determination module, a flow velocity determination module and a flow rate determination module, wherein, the magnetization treatment module is configured to perform a first magnetization treatment and a second magnetization treatment on multiphase fluid in a pipeline in a target oil and gas well, respectively, to obtain a first magnetized multiphase fluid and a second magnetized multiphase fluid, wherein the first magnetization treatment comprises a pre-magnetization treatment and a detection magnetization treatment, and the second magnetization treatment comprises a detection magnetization treatment;

the echo train signal amplitude value determination module is configured to determine a first echo train signal set and a second echo train signal set corresponding to the first magnetized multiphase fluid and the second magnetized multiphase fluid, respectively, wherein the first echo train signal set comprises a first amplitude value of a first echo train signal corresponding to a specified horizon position, and the second echo train signal set comprises a first amplitude value of a second echo train signal corresponding to the specified horizon position;

the content determination module is configured to determine contents of an oil phase component, a water phase component, and a gas phase component of the multiphase fluid at the specified horizon position according to the first amplitude value of the first echo train signal and the first amplitude value of the second echo train signal;

the flow velocity determination module is configured to determine a flow velocity of the multiphase fluid at the specified horizon position according to the first amplitude value of the first echo train signal;

the flow rate determination module is configured to determine flow rates of the oil phase component, the water phase component and the gas phase component in the multiphase fluid, according to the contents of the oil phase component, the water phase component and the gas phase component of the multiphase fluid at the specified horizon position and the flow velocity of the multiphase fluid at the specified horizon position.

The embodiments of the present application provide a method and an apparatus for determining flow rates of components of multiphase fluid. Thus, a first magnetization treatment and a second magnetization treatment may be performed on multiphase fluid in a pipeline in a target oil and gas well, respectively, to obtain a first magnetized multiphase fluid and a second magnetized multiphase fluid, wherein the first magnetization treatment comprises a pre-magnetization treatment and a detection magnetization treatment, and the second magnetization treatment comprises a detection magnetization treatment; a first echo train signal set and a second echo train signal set corresponding to the first magnetized multiphase fluid and the second magnetized multiphase fluid, respectively, may be determined, wherein the first echo train signal set comprises a first amplitude value of a first echo train signal corresponding to a specified horizon position, and the second echo train signal set comprises a first amplitude value of a second echo train signal corresponding to the specified horizon position; contents of an oil phase component, a water phase component, and a gas phase component of the multiphase fluid at the specified horizon position may be determined according to the first amplitude value of the first echo train signal and the first amplitude value of the second echo train signal, and a flow velocity of the multiphase fluid at the specified horizon position may be determined according to the first amplitude value of the first echo train signal; and flow rates of the oil phase component, the water phase component and the gas phase component of the multiphase fluid may be determined according to the contents of the oil phase component, the water phase component and the gas phase component of the multiphase fluid at the specified horizon position and the flow velocity of the multiphase fluid at the specified horizon position. The method of the present application perform an online measurement of the content and flow velocity of each component in the multiphase fluid based on the measurement principle of nuclear magnetic resonance, and the measurement result is less influenced by the factors such as high gas content, high water content, high viscosity and high salinity of the oil and gas well, thereby improving the accuracy of the determined flow rate of each component of the multiphase fluid.

BRIEF DESCRIPTION OF THE DRAWINGS

In order to more clearly describe the technical solutions in the embodiments of the present application or in the prior art, the drawings to be used in the descriptions of the embodiments or the prior art will be briefly introduced as follows. Obviously, the drawings in the following descriptions just illustrate some embodiments of the present application, and a person skilled in the art can obtain other drawings from these drawings without paying any creative effort.

FIG. 1 is a flowchart of a method embodiment for determining flow rates of components of multiphase fluid in the present application;

DETAILED DESCRIPTION OF THE PREFERRED EMBODIMENTS

Figure 2:
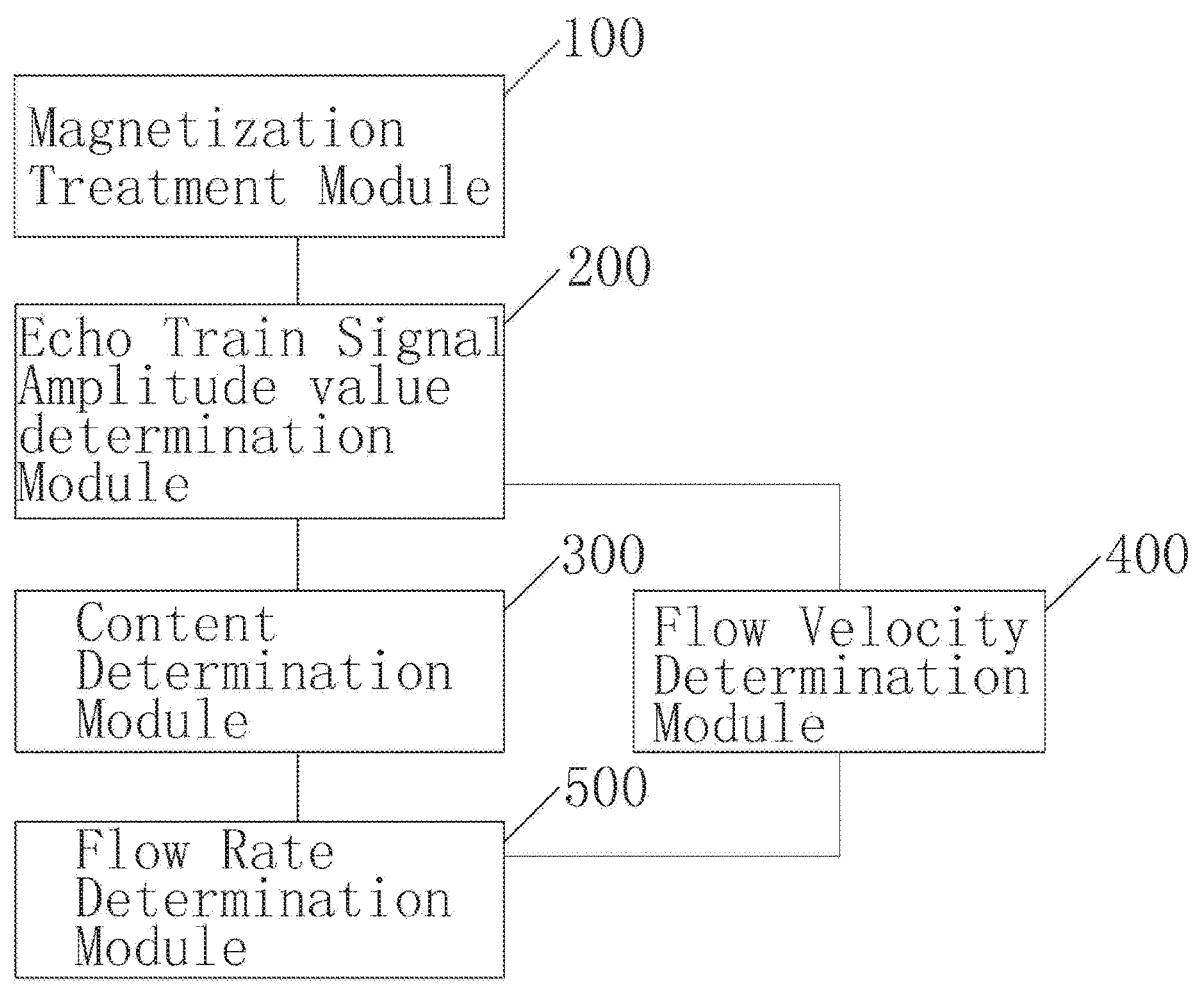
FIG. 2 is a composition structure diagram of an apparatus embodiment for determining flow rates of components of multiphase fluid in the present application.

The embodiments of the present application provide a method and an apparatus for determining flow rates of components of multiphase fluid.

In order that a person skilled in the art better understands the technical solutions in the present application, the technical solutions in the embodiments of the present application will be clearly and completely described as follows with reference to the drawings in the embodiments of the present application. Obviously, those described are just a part rather than all of the embodiments of the present application. Based on the embodiments of the present application, any other embodiment obtained by a person skilled in the art without paying any creative effort shall fall within the protection scope of the present application.

FIG. 1 is a flowchart of a method embodiment for determining flow rates of components of multiphase fluid in the present application. As illustrated in FIG. 1, the method for determining flow rates of components of multiphase fluid comprises:

Step S101: performing a first magnetization treatment and a second magnetization treatment on multiphase fluid in a pipeline in a target oil and gas well, respectively, to obtain first magnetized multiphase fluid and second magnetized multiphase fluid, wherein the first magnetization treatment comprises a pre-magnetization treatment and a detection magnetization treatment, and the second magnetization treatment comprises a detection magnetization treatment.

In this embodiment, the target oil and gas well may be an oil and gas well that has been or is being explored during an oil and gas exploration.

In this embodiment, an axial direction of the pipeline can be parallel to a horizontal plane.

In this embodiment, a first magnetization treatment and a second magnetization treatment may be performed on multiphase fluid in a pipeline in a target oil and gas well, respectively, to obtain a first magnetized multiphase fluid and a second magnetized multiphase fluid, wherein the first magnetization treatment comprises a pre-magnetization treatment and a detection magnetization treatment, and the second magnetization treatment comprises a detection magnetization treatment. Specifically, the first magnetization treatment may perform a pre-magnetization treatment on the multiphase fluid, and then perform a detection magnetization treatment on the pre-magnetized multiphase fluid.

In this embodiment, a magnetic field employed in the detection magnetization treatment may comprise a gradient magnetic field to calibrate positions of a plurality of horizons of the multiphase fluid in a stratified flow within the pipeline, wherein a direction of the gradient magnetic field is parallel to a radial direction of the pipeline and perpendicular to a horizontal plane. Specifically, after the detection magnetization treatment is performed on the multiphase fluid, when a specified pulse sequence is applied to the multiphase fluid gone through the detection magnetization treatment, a resonant frequency of an echo train signal generated by the multiphase fluid at any horizon position within the pipeline is correlated to a radial height of the pipeline. In this way, the positions of the plurality of horizons of the multiphase fluid in a stratified flow within the pipeline can be calibrated according to the resonant frequency of the received echo train signal.

In this embodiment, the gradient magnetic field may be a magnetic field changed linearly at a fixed gradient.

In this embodiment, the magnetic field employed in the pre-magnetization treatment may comprise a uniform magnetic field.

Step S102: determining a first echo train signal set and a second echo train signal set corresponding to the first magnetized multiphase fluid and the second magnetized multiphase fluid, respectively, wherein the first echo train signal set comprises a first amplitude value of a first echo train signal corresponding to a specified horizon position, and the second echo train signal set comprises a first amplitude value of a second echo train signal corresponding to the specified horizon position.

In this embodiment, the step of determining a first echo train signal set and a second echo train signal set corresponding to the first magnetized multiphase fluid and the second magnetized multiphase fluid, respectively, specifically may comprise: applying a specified pulse sequence to the first magnetized multiphase fluid so that the first magnetized multiphase fluid generates a first echo train signal set, and applying the specified pulse sequence to the second magnetized multiphase fluid so that the second magnetized multiphase fluid generates a second echo train signal set, wherein the specified horizon position represents any horizon position at which the multiphase fluid is in a stratified flow within the pipeline, and wherein the first echo train signal set may comprise a first amplitude value of a first echo train signal corresponding to a specified horizon position, and the second echo train signal set may comprise a first amplitude value of a second echo train signal corresponding to the specified horizon position.

In this embodiment, the specified pulse sequence may be a Carr-Purcell-Meiboom-Gill (CPMG) pulse sequence.

Step S103: determining contents of an oil phase component, a water phase component, and a gas phase component of the multiphase fluid at the specified horizon position according to the first amplitude value of the first echo train signal and the first amplitude value of the second echo train signal, and determining a flow velocity of the multiphase fluid at the specified horizon position according to the first amplitude value of the first echo train signal.

In this embodiment, the step of determining contents of an oil phase component, a water phase component, and a gas phase component of the multiphase fluid at the specified horizon position according to the first amplitude value of the first echo train signal and the first amplitude value of the second echo train signal specifically may comprise: performing the first magnetization treatment on pure gas phase fluid and pure liquid phase fluid in the pipeline in the target oil and gas well, respectively, to obtain first magnetized pure gas phase fluid and first magnetized pure liquid phase fluid, wherein the pure liquid phase fluid comprises an oil phase component and a water phase component; determining a pure gas phase echo train signal set and a pure liquid phase echo train signal set corresponding to the first magnetized pure gas phase fluid and the first magnetized pure liquid phase fluid, respectively, wherein the pure gas phase echo train signal set comprises a first amplitude value of a pure gas phase echo train signal corresponding to the specified horizon position, and the pure liquid phase echo train signal set comprises a first amplitude value of a pure liquid phase echo train signal corresponding to the specified horizon position; determining a content of a gas phase component of the multiphase fluid at the specified horizon position according to the first amplitude value of the pure gas phase echo train signal, the first amplitude value of the pure liquid phase echo train signal and the first amplitude value of the first echo train signal; and determining contents of the oil phase component and the water phase component of the multiphase fluid at the specified horizon position based on the content of the gas phase component of the multiphase fluid at the specified horizon position, the first amplitude value of the first echo train signal and the first amplitude value of the second echo train signal.

In this embodiment, the step of determining a pure gas phase echo train signal set and a pure liquid phase echo train signal set corresponding to the first magnetized pure gas phase fluid and the first magnetized pure liquid phase fluid, respectively, specifically may comprise: applying the specified pulse sequence to the first magnetized pure gas phase fluid so that the first magnetized pure gas phase fluid generates a pure gas phase echo train signal set, and applying the specified pulse sequence to the second magnetized pure liquid phase fluid so that the second magnetized pure liquid phase fluid generates a pure liquid phase echo train signal set.

In this embodiment, the content of the gas phase component of the multiphase fluid at the specified horizon position may be determined using the following equation:

$$A_G = \frac{M_{100\% \, L} - M_{meas}}{M_{100\% \, L} - M_{100\% \, G}}$$

wherein $A_G$ denotes the content of the gas phase component of the multiphase fluid at the specified horizon position, $M_{meas}$ denotes the first amplitude value of the first echo train signal, $M_{100\% \, L}$ denotes the first amplitude value of the pure liquid phase echo train signal, and $M_{100\% \, G}$ denotes the first amplitude value of the pure gas phase echo train signal.

In this embodiment, the step of determining contents of the oil phase component and the water phase component of the multiphase fluid at the specified horizon position based on the content of the gas phase component of the multiphase fluid at the specified horizon position, the first amplitude value of the first echo train signal and the first amplitude value of the second echo train signal specifically may comprise: subtracting the first amplitude value of the echo train signal corresponding to the gas phase component from the first amplitude value of the first echo train signal and the first amplitude value of the second echo train signal, respectively, based on the content of the gas phase component of the multiphase fluid at the specified horizon position, so as to obtain a first amplitude value of an echo train signal corresponding to the pure liquid phase fluid among the first echo train signals, and a first amplitude value of an echo train signal corresponding to the pure liquid phase fluid among the second echo train signals; determining the content of the oil phase component and the content of the water phase component of the multiphase fluid at the specified horizon position, according to the first amplitude value of the echo train signal corresponding to the pure liquid phase fluid among the first echo train signals, and the first amplitude value of the echo train signal corresponding to the pure liquid phase fluid among the second echo train signals.

In this embodiment, the content of the oil phase component and the content of the water phase component of the multiphase fluid at the specified horizon position may be determined using the following equation:

$$M_1 = M(0)\left[1 - \exp\left(-\frac{t_{pre} + t_{det}}{T_{1,water}}\right)\right] \Box A_{water} + M(0)\left[1 - \exp\left(-\frac{t_{pre} + t_{det}}{T_{1,oil}}\right)\right] \Box A_{oil}$$

$$M_2 = M(0)\left[1 - \exp\left(-\frac{t_{det}}{T_{1,water}}\right)\right] \Box A_{water} + M(0)\left[1 - \exp\left(-\frac{t_{det}}{T_{1,oil}}\right)\right] \Box A_{oil}$$

wherein $M_1$ and $M_2$ denote the first amplitude value of the echo train signal corresponding to the pure liquid phase fluid among the first echo train signals, and the first amplitude value of the echo train signal corresponding to the pure liquid phase fluid among the second echo train signals, respectively; $M(0)$ denotes a magnetization vector after the multiphase fluid is completely magnetized; $t_{pre}$ and $t_{det}$ denote time of the pre-magnetization treatment and time of the detection magnetization treatment, respectively; $T_{1,water}$ and $T_{1,oil}$ denote longitudinal relaxation time of water and longitudinal relaxation time of oil, respectively; and $A_{water}$ and $A_{oil}$ denote the content of the water phase component and the content of the oil phase component of the multiphase fluid at the specified horizon position.

In this embodiment, as the flow velocity of the multiphase fluid increases, the number of the hydrogen nucleuses of the multiphase fluid occurring the nuclear magnetic resonance phenomenon within a fixed period decreases, i.e., the first amplitude value of the acquired echo train signal decreases, and thus the flow velocity of the multiphase fluid at the specified horizon position is in an inverse proportional relationship with the first amplitude value of the first echo train signal, wherein the inverse proportional relationship may be a reciprocal relationship, or an inverse proportional relationship gone through a linear or nonlinear symbolic operation. Thus, the step of determining the flow velocity of the multiphase fluid at the specified horizon position according to the first amplitude value of the first echo train signal specifically may comprise: determining the flow velocity of the multiphase fluid at the specified horizon position according to the inverse proportional relationship and the first amplitude value of the first echo train signal.

Step S104: determining flow rates of the oil phase component, the water phase component and the gas phase component in the multiphase fluid, according to the contents of the oil phase component, the water phase component and the gas phase component of the multiphase fluid at the specified horizon position and the flow velocity of the multiphase fluid at the specified horizon position.

In this embodiment, the step of determining the total flow rate of the oil phase component, the water phase component and the gas phase component in the multiphase fluid according to the contents of the oil phase component, the water phase component and the gas phase component of the multiphase fluid at the specified horizon position and the flow velocity of the multiphase fluid at the specified horizon position specifically may comprise: determining the sub-flow rates of the oil phase component, the water phase component and the gas phase component of the multiphase fluid at the specified horizon position, according to the contents of the oil phase component, the water phase component and the gas phase component of the multiphase fluid at the specified horizon position and the flow velocity of the multiphase fluid at the specified horizon position; and determining the total flow rate of the oil phase component, the water phase component and the gas phase component in the multiphase fluid according to the sub-flow rates of the oil phase component, the water phase component and the gas phase component of the multiphase fluid at the specified horizon position.

In the method embodiment for determining flow rates of components of multiphase fluid, a first magnetization treatment and a second magnetization treatment may be performed on multiphase fluid in a pipeline in a target oil and gas well, respectively, to obtain a first magnetized multiphase fluid and a second magnetized multiphase fluid, wherein the first magnetization treatment comprises a pre-magnetization treatment and a detection magnetization treatment, and the second magnetization treatment comprises a detection magnetization treatment; a first echo train signal set and a second echo train signal set corresponding to the first magnetized multiphase fluid and the second magnetized multiphase fluid, respectively, may be determined, wherein the first echo train signal set comprises a first amplitude value of a first echo train signal corresponding to a specified horizon position, and the second echo train signal set comprises a first amplitude value of a second echo train signal corresponding to the specified horizon position; contents of an oil phase component, a water phase component, and a gas phase component of the multiphase fluid at the specified horizon position may be determined according to the first amplitude value of the first echo train signal and the first amplitude value of the second echo train signal, and a flow velocity of the multiphase fluid at the specified horizon position may be determined according to the first amplitude value of the first echo train signal; and flow rates of the oil phase component, the water phase component and the gas phase component of the multiphase fluid may be determined according to the contents of the oil phase component, the water phase component and the gas phase component in the multiphase fluid at the specified horizon position and the flow velocity of the multiphase fluid at the specified horizon position. The method of the present application performs an online measurement of the content and flow velocity of each component in the multiphase fluid based on the measurement principle of nuclear magnetic resonance, and the measurement result is less influenced by the factors such as high gas content, high water content, high viscosity and high salinity of the oil and gas well, thereby improving the accuracy of the determined flow rate of each component of the multiphase fluid.

FIG. 2 is a composition structure diagram of an apparatus embodiment for determining flow rates of components of multiphase fluid in the present application. As illustrated in FIG. 2, the apparatus for determining flow rates of components of multiphase fluid may comprise: a magnetization treatment module 100, an echo train signal amplitude value determination module 200, a content determination module 300, a flow velocity determination module 400, and a flow rate determination module 500.

The magnetization treatment module 100 may be configured to perform a first magnetization treatment and a second magnetization treatment on multiphase fluid in a pipeline in a target oil and gas well, respectively, to obtain a first magnetized multiphase fluid and a second magnetized multiphase fluid, wherein the first magnetization treatment comprises a pre-magnetization treatment and a detection magnetization treatment, and the second magnetization treatment comprises a detection magnetization treatment.

The echo train signal amplitude value determination module 200 may be configured to determine a first echo train signal set and a second echo train signal set corresponding to the first magnetized multiphase fluid and the second magnetized multiphase fluid, respectively, wherein the first echo train signal set comprises a first amplitude value of a first echo train signal corresponding to a specified horizon position, and the second echo train signal set comprises a first amplitude value of a second echo train signal corresponding to the specified horizon position.

The content determination module 300 may be configured to determine contents of an oil phase component, a water phase component, and a gas phase component of the multiphase fluid at the specified horizon position according to the first amplitude value of the first echo train signal and the first amplitude value of the second echo train signal.

The flow velocity determination module 400 may be configured to determine a flow velocity of the multiphase fluid at the specified horizon position according to the first amplitude value of the first echo train signal.

The flow rate determination module 500 may be configured to determine flow rates of the oil phase component, the water phase component and the gas phase component in the multiphase fluid, according to the contents of the oil phase component, the water phase component and the gas phase component of the multiphase fluid at the specified horizon position and the flow velocity of the multiphase fluid at the specified horizon position.

The apparatus embodiment for determining flow rates of components of multiphase fluid is corresponding to the method embodiment for determining flow rates of components of multiphase fluid, and can implement the technical solution of the method embodiment for determining flow rates of components of multiphase fluid, and achieve the technical effect of the method embodiment.

In the 1990s, for a technical improvement, it can be very obviously distinguished whether it is a hardware improvement (e.g., an improvement to a circuit structure such as a diode, a transistor, a switch, etc.) or a software improvement (an improvement to a methodological flow). However, with the development of the technology, many improvements to the methodological flow have been deemed as direct improvements to the hardware circuit structure. The designers almost program the improved methodological flow into a hardware circuit to obtain corresponding hardware circuit structure. Thus, an improvement of one methodological flow may also be implemented by a hardware entity module. For example, a Programmable Logic Device (PLD) (e.g., a Field Programmable Gate Array (FPGA)) is such an integrated circuit whose logical functions are determined by the user programming the device. The designer "integrates" a digital system onto a PLD through a programming by himself, without requiring the chip manufacturer to design and fabricate the Application Specific Integrated Circuit (ASIC) chip. In addition, nowadays instead of manually fabricating the integrated circuit chip, the programming is usually realized using software "logic compiler", which is similar to the software compiler used in program development and writing. The original codes before compiling also need to be written in a particular programming language, which is referred to as Hardware Description Language (HDL), including many types such as Advanced Boolean Expression Language (ABEL), Altera Hardware Description Language (AHDL), Confluence, Cornell University Programming Language (CUPL), HDCal, Java Hardware Description Language (JHDL), Lava, Lola, MyHDL, PALASM, Ruby Hardware Description Language (RHDL), etc., and currently Very-High-Speed Integrated Circuit Hardware Description Language (VHDL) and Verilog2 are most widely used. A person skilled in the art should be clear that a hardware circuit for realizing the logical methodical flow can be easily obtained by a simple logic programming of the methodical flow into an integrated circuit using the above hardware description languages.

As known to a person skilled in the art, in addition to implementing the controller merely using computer readable program codes, by logically programming the methodical steps, the controller is enabled to realize the same function in the form of a logic gate, a switch, an ASIC, a programmable logic controller, an embedded microcontroller, etc. Thus, such a controller may be deemed as a hardware component, while means included therein for realizing various functions may also be deemed as structures in the hardware component. Alternatively, those means for realizing various functions may even be deemed as not only software modules for implementing the method, but also structures in the hardware component.

The apparatus and modules described in the above embodiments may be implemented specifically by a computer chip or an entity, or a product having a certain function.

In order to facilitate the descriptions, the apparatus is described by divided functionally into various modules, respectively. Of course, during implementation of the present application, the functions of the respective modules may be realized in the same or a plurality of software and/or hardware.

From the descriptions of the above embodiments, a person skilled in the art can clearly understand that the present application can be implemented by means of software and a necessary universal hardware platform. Based on this understanding, the essence of the technical solution of the present application or a part thereof that makes a contribution to the prior art can be embodied in the form of a software product. In a typical configuration, the computing device comprises one or more processors (CPUs), an input/output interface, a network interface and a memory. The computer software product may include several instructions for causing a computer device (which may be a personal computer, a server, or a network device, etc.) to perform the methods described in various embodiments or some parts thereof in the present application. The computer software product may be stored in a memory which may have the form of a volatile memory, a Random-Access Memory (RAM) and/or a non-volatile memory, such as Read-Only Memory (ROM) or a flash RAM, etc. among the computer readable medium. The memory is an example of the computer readable medium. The computer-readable medium includes permanent and non-permanent, removable and non-removable media, which can realize the information storage in any method or technique. The information can be computer readable instructions, data structures, program modules or other data. An example of the computer storage medium includes, but not limited to, a phase change memory (PRAM), a static random access memory (SRAM), a dynamic random access memory (DRAM), other types of random access memory (RAM), a read-only memory (ROM), an electrically erasable programmable read-only memory (EEPROM), a flash memory or other memory techniques, a compact disk read only memory (CD-ROM), a digital versatile disc (DVD) or other optical storages, magnetic cassette tapes, tape magnetic diskettes storage or other magnetic storage device or any other non-transmission medium, which can be used for the storage of information accessible to a computing device. According to the definitions herein, the computer readable medium does not include any temporary computer readable media (transitory media), such as modulated data signal and carrier wave.

The various embodiments herein are all described in a progressive manner, and the same or similar portions of the various embodiments can refer to each other. Each embodiment lays an emphasis on its distinctions from other embodiments. In particular, the description for the apparatus embodiment is relatively simple, since it is substantially similar to the method embodiment, and please refers to the descriptions of the method embodiment for the relevant portion.

The present application is applicable to numerous general or dedicated computer system environments or configurations, such as a personal computer, a server computer, a handheld or portable device, a tablet device, a multiprocessor system, a microprocessor-based system, a set-top box, a programmable consumer electronic device, a network PC, a minicomputer, a mainframe computer, a distributed computing environment including any of the above systems or devices, etc.

The present application may be described in the general context of computer executable instructions executed by the computer, e.g., the program module. In general, the program module includes routine, program, object, component, data structure, etc. executing a particular task or realizing a particular abstract data type. The present application may also be practiced in the distributed computing environments in which tasks are executed by remote processing devices connected through a communication network. In the distributed computing environments, the program modules may be located in the local and remote computer storage medium including the storage device.

Although the present application has been described through the embodiments, a person skilled in the art knows that there are many modifications and changes to the present application without departing from the spirit of the present application, and it is intended that the appended claims include those modifications and changes without departing from the spirit of the present application.

The invention claimed is:

1. A method for determining flow rates of components of multiphase fluid, implemented by a processor and a computer-readable storage medium having computer executable instructions stored therein such that when executed, the computer executable instructions instruct the processor to perform the process of:

performing a first magnetization treatment and a second magnetization treatment on a multiphase fluid in a pipeline in a target oil and gas well, respectively, to obtain a respective first magnetized multiphase fluid and a second magnetized multiphase fluid, wherein the first magnetization treatment comprises a pre-magnetization treatment and a detection magnetization treatment, and the second magnetization treatment comprises the detection magnetization treatment;

determining a first echo train signal set corresponding to the first magnetized multiphase fluid and a second echo train signal set corresponding to the second magnetized multiphase fluid, respectively, wherein the first echo train signal set comprises a first amplitude value of a first echo train signal corresponding to a specified horizon position, and the second echo train signal set comprises a first amplitude value of a second echo train signal corresponding to the specified horizon position;

determining contents of an oil phase component, a water phase component, and a gas phase component of the multiphase fluid at the specified horizon position according to the first amplitude value of the first echo train signal and the first amplitude value of the second echo train signal, and determining a flow velocity of the multiphase fluid at the specified horizon position according to the first amplitude value of the first echo train signal; and determining flow rates of the oil phase component, the water phase component and the gas phase component in the multiphase fluid, according to the contents of the oil phase component, the water phase component and the gas phase component of the multiphase fluid at the specified horizon position and the flow velocity of the multiphase fluid at the specified horizon position.

2. The method for determining flow rates of components of multiphase fluid according to claim 1, wherein the step of determining a first echo train signal set and a second echo train signal set corresponding to the first magnetized multiphase fluid and the second magnetized multiphase fluid, respectively, comprises:

applying a specified pulse sequence to the first magnetized multiphase fluid so that the first magnetized multiphase fluid generates a first echo train signal set, and applying the specified pulse sequence to the second magnetized multiphase fluid so that the second magnetized multiphase fluid generates a second echo train signal set.

3. The method for determining flow rates of components of multiphase fluid according to claim 2, wherein a magnetic field employed in the detection magnetization treatment comprises a gradient magnetic field to calibrate positions of a plurality of horizons of the multiphase fluid in a stratified flow within the pipeline, and wherein a direction of the gradient magnetic field is parallel to a radial direction of the pipeline and perpendicular to a horizontal plane.

4. The method for determining flow rates of components of multiphase fluid according to claim 3, wherein the magnetic field employed in the pre-magnetization treatment comprises a uniform magnetic field.

5. The method for determining flow rates of components of multiphase fluid according to claim 4, wherein the step of determining contents of an oil phase component, a water phase component, and a gas phase component of the multiphase fluid at the specified horizon position according to the first amplitude value of the first echo train signal and the first amplitude value of the second echo train signal comprises:

performing the first magnetization treatment on gas phase fluid and liquid phase fluid in the pipeline in the target oil and gas well, respectively, to obtain first magnetized gas phase fluid and first magnetized liquid phase fluid; wherein the liquid phase fluid comprises an oil phase component and a water phase component;

determining a gas phase echo train signal set and a liquid phase echo train signal set corresponding to the first magnetized gas phase fluid and the first magnetized liquid phase fluid, respectively, wherein the gas phase echo train signal set comprises a first amplitude value of a gas phase echo train signal corresponding to the specified horizon position, and the liquid phase echo train signal set comprises a first amplitude value of a liquid phase echo train signal corresponding to the specified horizon position;

determining a content of a gas phase component of the multiphase fluid at the specified horizon position according to the first amplitude value of the gas phase echo train signal, the first amplitude value of the liquid phase echo train signal and the first amplitude value of the first echo train signal; and determining contents of the oil phase component and the water phase component of the multiphase fluid at the specified horizon position based on the content of the gas phase component of the multiphase fluid at the specified horizon position, the first amplitude value of the first echo train signal and the first amplitude value of the second echo train signal.

6. The method for determining flow rates of components of multiphase fluid according to claim 5, wherein the step of determining a gas phase echo train signal set and a liquid phase echo train signal set corresponding to the first magnetized gas phase fluid and the first magnetized liquid phase fluid, respectively, comprises:

applying the specified pulse sequence to the first magnetized pure gas phase fluid so that the first magnetized gas phase fluid generates a gas phase echo train signal set, and applying the specified pulse sequence to the second magnetized liquid phase fluid so that the second magnetized liquid phase fluid generates a liquid phase echo train signal set.

7. The method for determining flow rates of components of multiphase fluid according to claim 5, wherein the content of the gas phase component of the multiphase fluid at the specified horizon position is determined using the following equation:

$$A_G = \frac{M_{100\% \ L} - M_{meas}}{M_{100\% \ L} - M_{100\% \ G}}$$

wherein $A_G$ denotes the content of the gas phase component of the multiphase fluid at the specified horizon position, $M_{meas}$ denotes the first amplitude value of the first echo train signal, $M_{100\% \ L}$ denotes the first amplitude value of the liquid phase echo train signal, and $M_{100\% \ G}$ denotes the first amplitude value of the gas phase echo train signal.

8. The method for determining flow rates of components of multiphase fluid according to claim 5, wherein the step of determining contents of the oil phase component and the water phase component of the multiphase fluid at the specified horizon position based on the content of the gas phase component of the multiphase fluid at the specified horizon position, the first amplitude value of the first echo train signal and the first amplitude value of the second echo train signal comprises:

subtracting the first amplitude value of the echo train signal corresponding to the gas phase component from the first amplitude value of the first echo train signal and the first amplitude value of the second echo train signal, respectively, based on the content of the gas phase component of the multiphase fluid at the specified horizon position, so as to obtain a first amplitude value of an echo train signal corresponding to the liquid phase fluid among the first echo train signals, and a first amplitude value of an echo train signal corresponding to the liquid phase fluid among the second echo train signals; and determining the content of the oil phase component and the content of the water phase component of the multiphase fluid at the specified horizon position, according to the first amplitude value of the echo train signal corresponding to the liquid phase fluid among the first echo train signals, and the first amplitude value of the echo train signal corresponding to the liquid phase fluid among the second echo train signals.

9. The method for determining flow rates of components of multiphase fluid according to claim 8, wherein the content of the oil phase component and the content of the water phase component of the multiphase fluid at the specified horizon position are determined using the following equation:

$$M_1 = M(0)\left[1 - \exp\left(-\frac{t_{pre} + t_{det}}{T_{1,water}}\right)\right] \Box A_{water} + M(0)\left[1 - \exp\left(-\frac{t_{pre} + t_{det}}{T_{1,oil}}\right)\right] \Box A_{oil}$$

$$M_2 = M(0)\left[1 - \exp\left(-\frac{t_{det}}{T_{1,water}}\right)\right] \Box A_{water} + M(0)\left[1 - \exp\left(-\frac{t_{det}}{T_{1,oil}}\right)\right] \Box A_{oil}$$

wherein $M_1$ and $M_2$ denote the first amplitude value of the echo train signal corresponding to the liquid phase fluid among the first echo train signals, and the first amplitude value of the echo train signal corresponding to the liquid phase fluid among the second echo train signals, respectively; M (0) denotes a magnetization vector after the multiphase fluid is completely magnetized; $t_{pre}$ and $t_{det}$ denote time of the pre-magnetization treatment and time of the detection magnetization treatment, respectively; $T_{1,water}$ and $T_{1,oil}$ denote longitudinal relaxation time of the water phase component and longitudinal relaxation time of the oil phase component in the multiphase fluid, respectively; and $A_{water}$ and $A_{oil}$ denote the content of the water phase component and the content of the oil phase component of the multiphase fluid at the specified horizon position, respectively.

10. An apparatus for determining flow rates of components of multiphase fluid, comprising: a processor and a computer readable storage medium having computer executable instructions stored therein, wherein the computer executable instructions, when executed, configure the processor to:

perform a first magnetization treatment and a second magnetization treatment on multiphase fluid in a pipeline in a target oil and gas well, respectively, to obtain a first magnetized multiphase fluid and a second magnetized multiphase fluid, wherein the first magnetization treatment comprises a pre-magnetization treatment and a detection magnetization treatment, and the second magnetization treatment comprises the detection magnetization treatment;

determine a first echo train signal set corresponding to the first magnetized multiphase fluid and a second echo train signal set corresponding to the second magnetized multiphase fluid, respectively, wherein the first echo train signal set comprises a first amplitude value of a first echo train signal corresponding to a specified horizon position, and the second echo train signal set comprises a first amplitude value of a second echo train signal corresponding to the specified horizon position;

determine contents of an oil phase component, a water phase component, and a gas phase component of the multiphase fluid at the specified horizon position according to the first amplitude value of the first echo train signal and the first amplitude value of the second echo train signal;

determine a flow velocity of the multiphase fluid at the specified horizon position according to the first amplitude value of the first echo train signal;

determine flow rates of the oil phase component, the water phase component and the gas phase component in the multiphase fluid, according to the contents of the oil phase component, the water phase component and the gas phase component of the multiphase fluid at the specified horizon position and the flow velocity of the multiphase fluid at the specified horizon position.

* * * * *